(12) United States Patent
Hwang et al.

(10) Patent No.: US 6,353,570 B2
(45) Date of Patent: Mar. 5, 2002

(54) ROW REDUNDANCY CIRCUIT USING A FUSE BOX INDEPENDENT OF BANKS

(75) Inventors: Soo-Man Hwang; Chang-Ho Do, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/741,738

(22) Filed: Dec. 21, 2000

(30) Foreign Application Priority Data

Dec. 22, 1999 (KR) ............................................ 99-60499

(51) Int. Cl.[7] ................................................ G11C 7/00
(52) U.S. Cl. ................ 365/225.7; 365/200; 365/230.03
(58) Field of Search ........................ 365/225.7, 230.03, 365/230.06, 193, 200, 189.05

(56) References Cited

U.S. PATENT DOCUMENTS

| | | | | |
|---|---|---|---|---|
| 5,422,850 A | * | 6/1995 | Sukegawa et al. | ............ 365/200 |
| 5,689,465 A | * | 11/1997 | Sukegawa et al. | ............ 365/200 |
| 5,859,801 A | * | 1/1999 | Poechmueller | ............... 365/200 |
| 6,141,281 A | * | 10/2000 | Mobley et al. | ............ 365/225.7 |
| 6,185,135 B1 | * | 2/2001 | Netis et al. | .................. 365/194 |

* cited by examiner

Primary Examiner—David Nelms
Assistant Examiner—Thong Le
(74) Attorney, Agent, or Firm—Jacobson Holman, PLLC

(57) ABSTRACT

A row redundancy circuit for use in a semiconductor memory device of the present invention having a fuse box independent of banks so as to improve repair efficiency. The row redundancy circuit includes a fuse box coupled to a row address and a bank address from an address buffer in which a fuse corresponding to an address of a word line to be repaired blows-out, a row fuse decoder for AND-operating two outputs of the fuse box, and a bank row address latch coupled to the output of the row fuse decoder for determining a location of a redundant word line in a block to be repaired.

8 Claims, 10 Drawing Sheets

US 6,353,570 B2

ROW REDUNDANCY CIRCUIT USING A FUSE BOX INDEPENDENT OF BANKS

FIELD OF THE INVENTION

The present invention relates to a semiconductor memory device and, more particularly, to a row redundancy circuit.

PRIOR ART OF THE INVENTION

Generally, because the cost of a semiconductor memory device depends on its yield, redundancy memory cells are added to normal cells to improve the yield. To do this, a method for repairing defective memory cells by replacing them with the redundancy memory cells has been used. However, in highly integrated and large capacity devices higher than 256 Mb, power consumption is increased as a result of unexpected current paths generated during waiting state of the memory device due to bridges generated during processing as the size of a chip is increased. In addition, insufficiency of planer margin due to narrowed line width leads to frequent generation of defects.

FIG. 1 shows a block diagram for the concept of a conventional row redundancy structure. Referring to FIG. 1, a memory cell block is divided into 4 banks, with each bank including 8 sub-memory cell blocks. Each of the sub-memory cell blocks includes two redundancy word line pairs, at its top and its bottom, and a redundancy word line driver rwl for selecting and driving a redundancy word line pair. The four banks are aligned in columns to form a fundamental group and the fundamental group includes a fuse box array for selecting the sub-memory cell block and the redundancy word line to be repaired.

In operation, after one of the four banks is selected by a bank selecting circuit, if there is no blown-out fuse in the fuse box of the fuse box array, the output of the fuse box activates a row decoder through a circuit for OR-operating the outputs of the fuses in the fuse box array. If the fuse corresponding to the address of the corresponding sub-memory cell block is blown-out, the output of the fuse box activates the redundancy word line through a circuit for detecting the output signal and deactivates normal word lines.

The fuse box array used with the structure of FIG. 1 is associated with the banks. That is, when a failed word line is generated in a bank0, the fuse in the fuse box associated with the bank0 should be blown-out indicating needed repair of the failed word line.

In the conventional method for repairing the row word line of the failed bank by using only the fuse box associated with the bank, repair is impossible if the number of the redundancy word lines is larger than that of the word lines having fail bits in a bank.

If the number of the fuse boxes and the redundant word lines are included in the bank in order to solve this problem, repair efficiency is reduced because cost is increased and only the fuse boxes connected within the bank should be used for repairing.

SUMMARY OF THE INVENTION

Therefore, it is an object of the present invention to provide a row redundancy circuit capable of improving repair efficiency by repairing independently of banks.

In accordance with an aspect of the present invention, there is provided a row redundant circuit in a semiconductor memory device, the circuit comprising a fuse box coupled to a row address and a bank address from an address buffer in which a fuse corresponding to an address of a word line to be repaired blows-out; a row fuse decoder for AND-operating two outputs of the fuse box; and a bank row address latching unit coupled to the output of the row fuse decoder for determining the location of a redundant word line in a block to be repaired.

BRIEF DESCRIPTION OF THE DRAWINGS

The above and other objects and features of the instant invention will become apparent from the following description of preferred embodiments taken in conjunction with the accompanying drawings, in which.

PREFERRED EMBODIMENT OF THE INVENTION

The present invention discloses a configuration in which information for a sub-memory cell block as well as information for a bank within which a word line to be repaired is located are applied to a fuse box. Therefore, the present invention is capable of repairing a failed word line with a fuse box because an arbitrary fuse box can repair the failed word line independently of the bank and the sub-memory cell block to which the failed word line belongs, so as to improve efficiency.

Hereinafter, preferred embodiments of the present invention will be described in detail with reference to the accompanying drawings.

Figure 1:
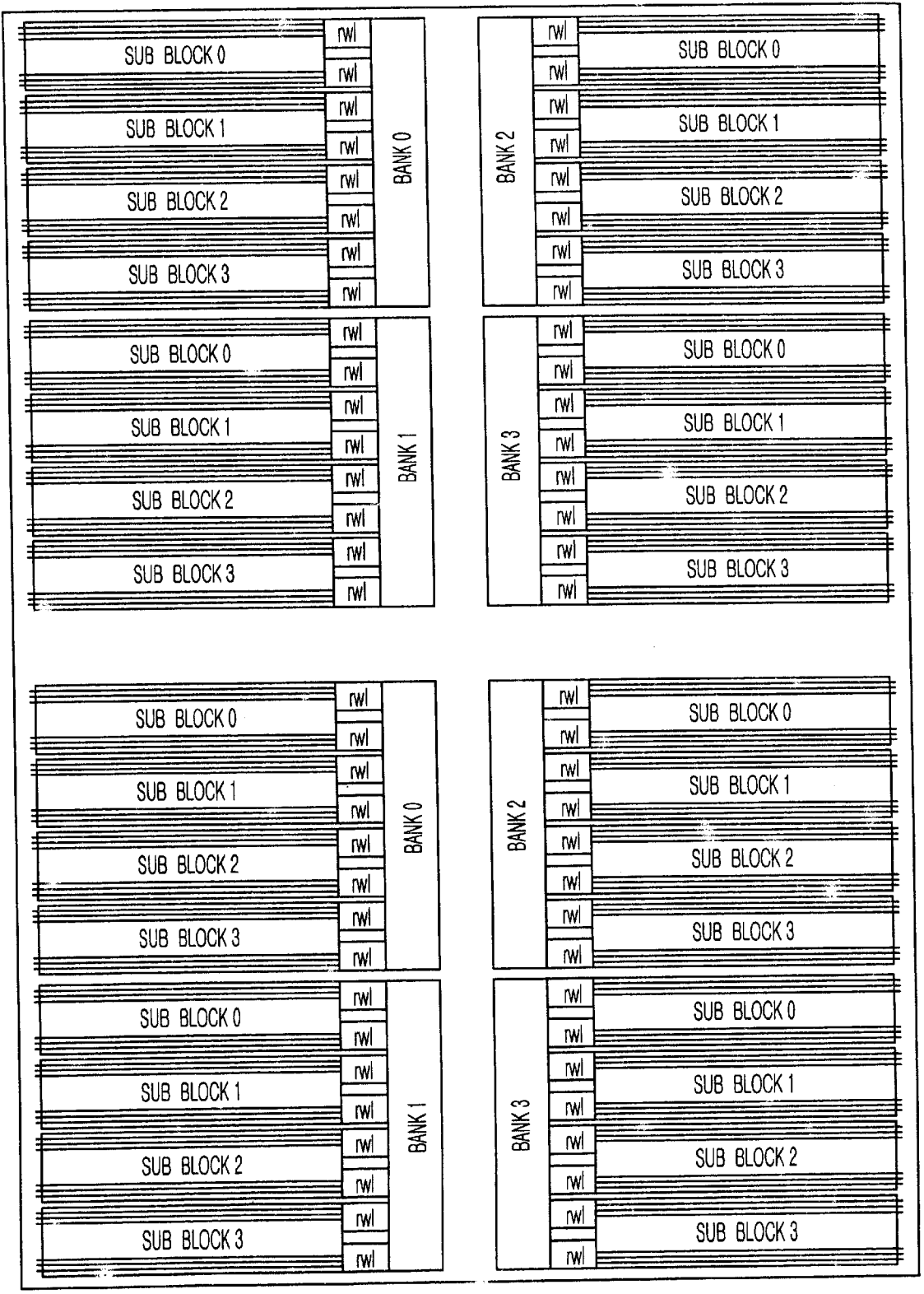
FIG. 1 shows a block diagram for the concept of a conventional row redundancy structure.
Figure 2:
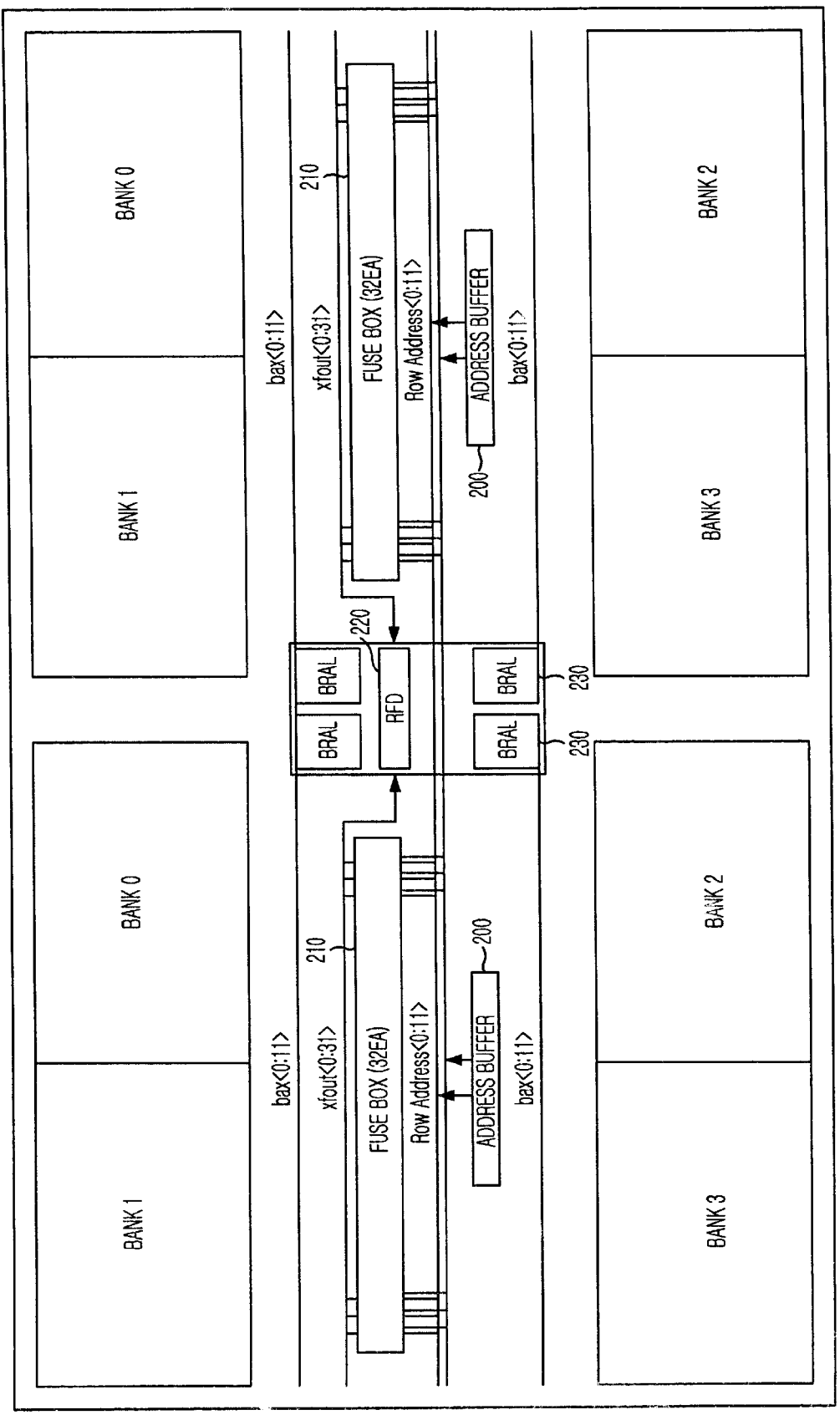
FIG. 2 shows a block diagram for the concept of a row redundancy structure in accordance with the present invention.

FIG. 2 shows a block diagram for the concept of a row redundancy structure in accordance with the present invention. Referring to FIG. 2, there are included four banks Bank0, Bank1, Bank2, Bank3, having a total of 64M cells, each including 16M cells, an address buffer 200 receiving an external address to generate a row address, a fuse box 210 coupled to the row address and a bank address from the address buffer 200 for selecting a word line to be repaired, a row fuse decoder 220 for combining two outputs of the fuse box, and a bank row address latch 230 coupled to the output of the row fuse decoder 220 for determining the location of a redundant word line in a block to be repaired.

Since the row address and the bank address are applied to the fuse box, an arbitrary fuse box can be used to repair when row fail happens.

Figure 3:
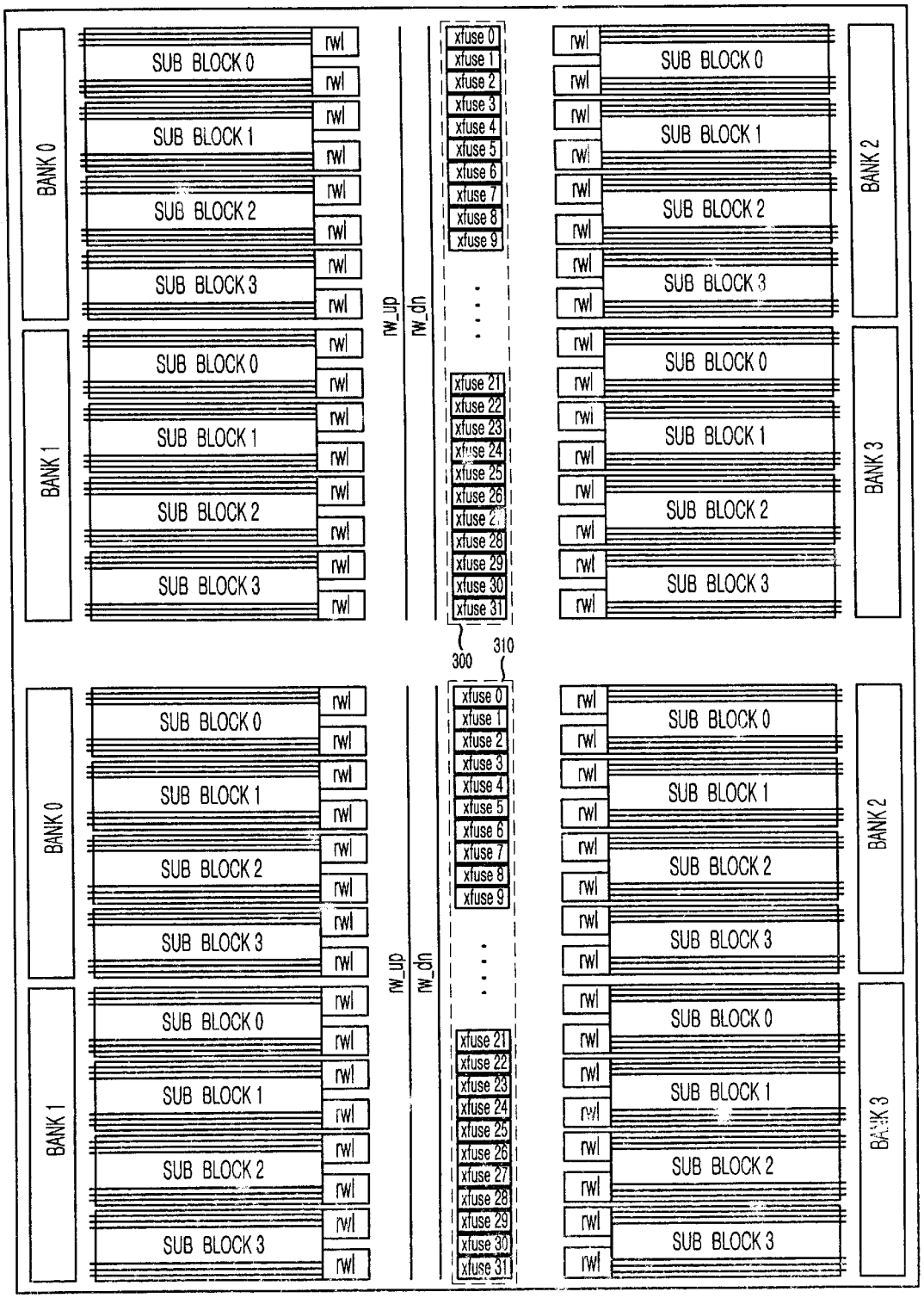
FIG. 3 is a block diagram showing a relationship between a fuse box and sub-blocks in a bank in accordance with the present invention.

FIG. 3 is a block diagram showing a relationship between the fuse box and sub-blocks in a bank in accordance with the present invention. Referring to FIG. 3, there are provided the four banks Bank0, Bank1, Bank2, Bank3, and four sub-blocks are aligned in the column direction in each bank. Each sub-block includes two redundant word line pairs at its top and its bottom and a redundant word line driver rw1 is included at the end of each redundant word line for selecting and driving the respective redundant word line pair. There are provided two fuse box arrays 300, 310, each including 32 unit fuse boxes. Each of the fuse box arrays can replace the 16 sub-blocks globally.

Figure 4:
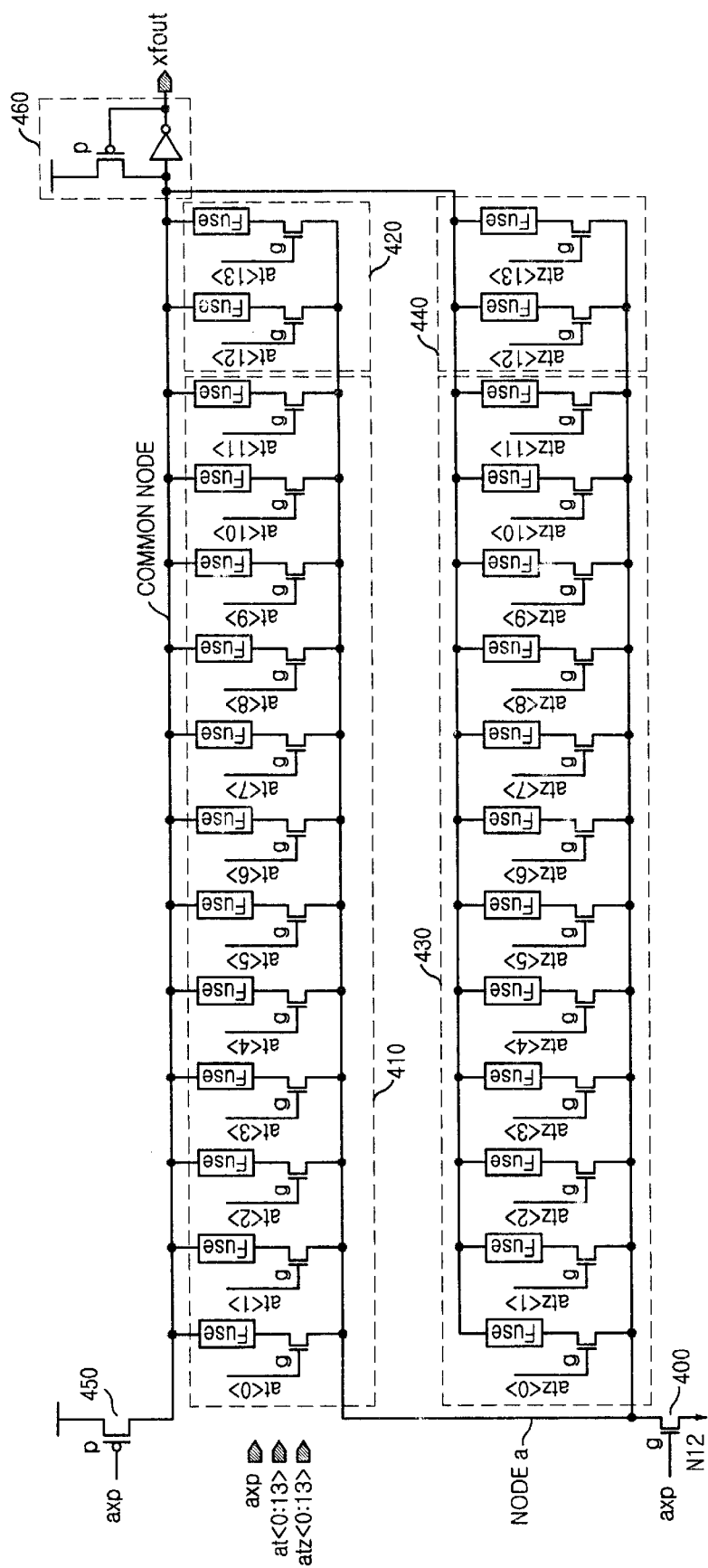
FIG. 4 is a circuit diagram of the fuse box in accordance with the present invention.

FIG. 4 provides a circuit diagram of the fuse box in accordance with the present invention. Referring to FIG. 4, the fuse box of the present invention includes an NMOS transistor 400 having a gate coupled to a fuse pre-charge signal axp and a source-drain formed between a node a and a ground, a first NMOS transistor 410 having a gate coupled to the row address at<0:11> and a source-drain formed between a common node and a node a, a second NMOS transistor 420 having a gate coupled to the bank address at<12:13> and a source-drain formed between the common node and the node a, a third NMOS transistor 430 having a gate coupled to the row address atz<0:11> and a source-drain formed between the common node and the node a, a fourth NMOS transistor 440 having a gate coupled to the bank address atz<12:13> and a source-drain formed between the common node and the node a, a PMOS transistor 450 having a gate coupled to the fuse pre-charge signal axp and a source-drain formed between a power voltage and the common node, and a latch 460 for latching a signal applied to the common node to output a fuse output signal xfout.

Figure 5:
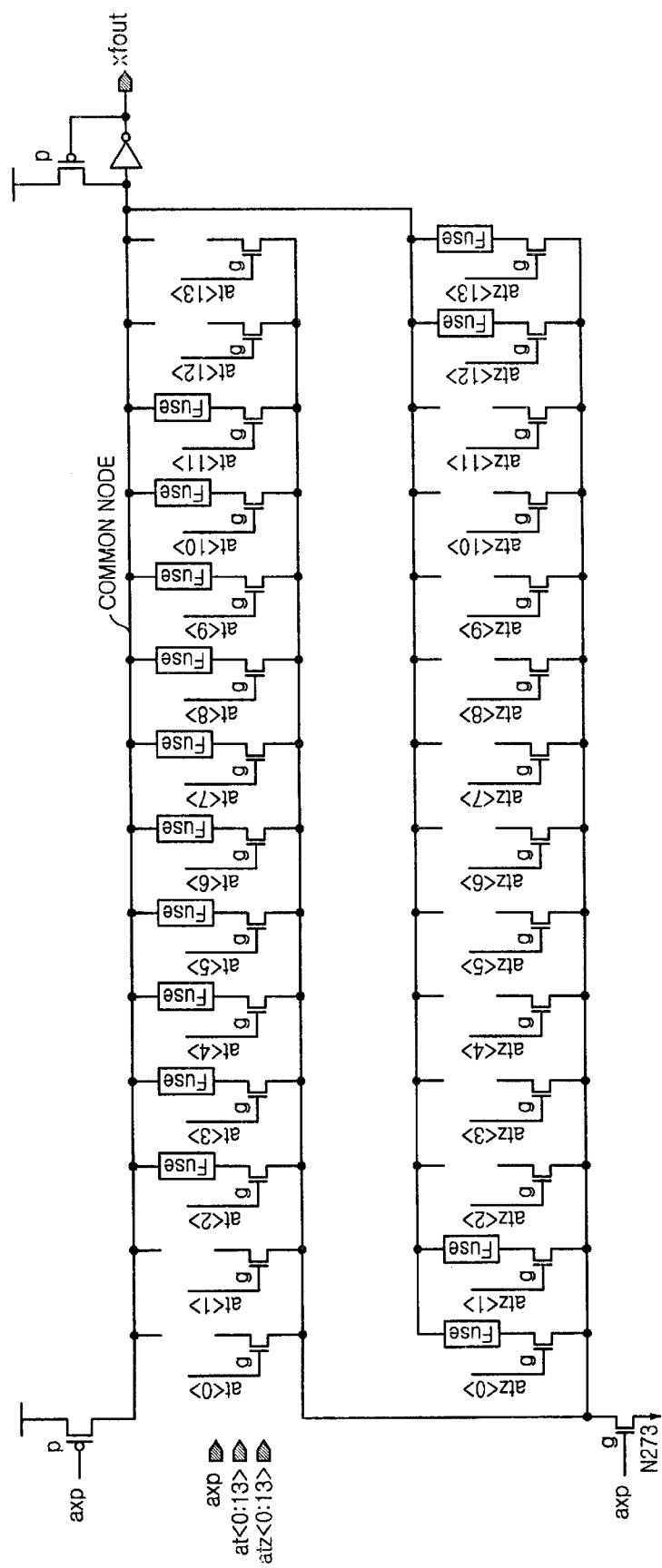
FIG. 5 is a circuit diagram in which a fuse corresponding to a failure is blown-out in the fuse box in accordance with the present invention.

FIG. 5 is a circuit diagram in which a fuse corresponding to a failure is blown-out in the fuse box in accordance with the present invention. The circuitry of FIG. 5 is similar to that of FIG. 4 and so a detailed description thereof will be omitted for the sake of simplicity.

Referring to FIGS. 4 and 5, the operation of the fuse box will be described in detail.

When the fuse pre-charge signal axp is activated as logic low, the common node is pre-charged to logic high and the fuse output signal xfout latches logic low. When the fuse pre-charge signal axp transits to logic high and the row address corresponding to a failure is activated, the fuse output signal xfout rises to logic high by pull-down operation of the first to fourth NMOS transistors if the fuse is not blown-out. In addition, the common node remains logic high by the PMOS transistor of the latch 460 to which the fuse output signal xfout is fed-back and the fuse output signal xfout remains logic low so as to notify that the row address corresponding to the failed word line is applied if the fuse is blown-out. After this, in word line deactivation operation, when the address signals at<0:13>, atz<0:13> are initialized to logic low and then the fuse pre-charge signal axp is initialized to logic low, the common node and the fuse output signal xfout are pre-charged.

Figure 6:
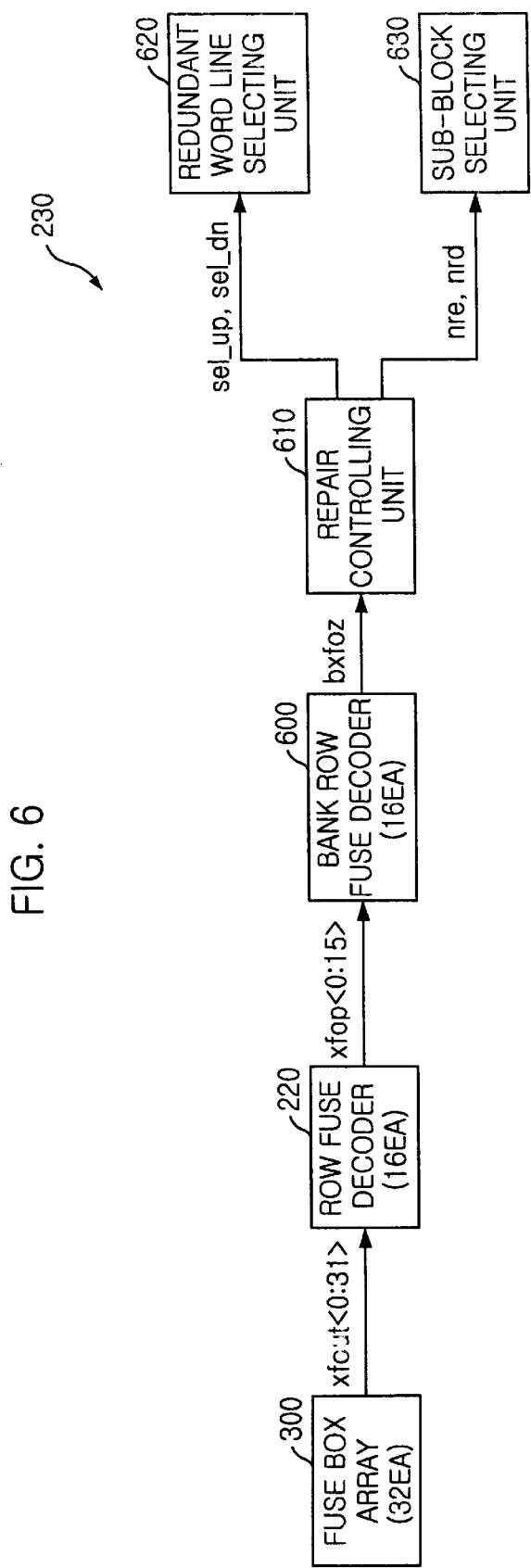
FIG. 6 is a block diagram showing the concept of a configuration of a bank row address latch in accordance with the present mention.

FIG. 6 is a block diagram showing the concept of a configuration of the bank row address latch 230. Referring to FIG. 6, the bank row address latch 230 includes a bank row fuse decoder 600 which receives a row fuse output signal xfop<0:15> from the row fuse decoder 220 for selecting a bank to be activated, a repair controlling unit 610 which receives a bank row fuse output signal bxfoz from the bank row fuse decoder 600 for selecting the location of the word line to be repaired, a redundant word line selecting unit 620 which receives an upper selection signal sel_up and a lower selection signal sel_dn from the repair controlling unit 610 for selecting a redundant word line in a sub-block, and a sub-block selecting unit 630 which receives a normal row enable signal nre and a normal row disable signal nrd from the repair controlling unit 610 for selecting one of four sub-blocks in the bank.

Figure 7:
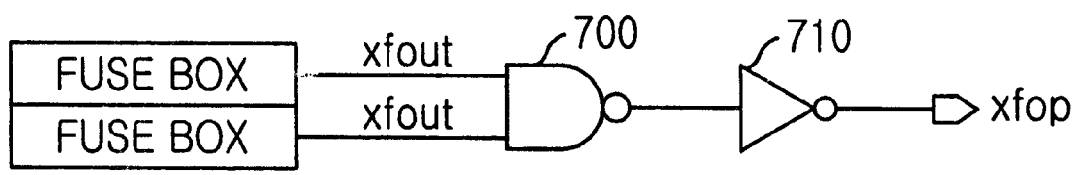
FIG. 7 is a circuit diagram of a row fuse decoder in accordance with the present invention.

FIG. 7 shows a circuit diagram of a row fuse decoder 220.

Referring to FIG. 7, the row fuse decoder includes a NAND gate 700 which receives the fuse output signal xfout from the fuse box and an inverter 710 for inverting the output of the NAND gate 700.

Figure 8:
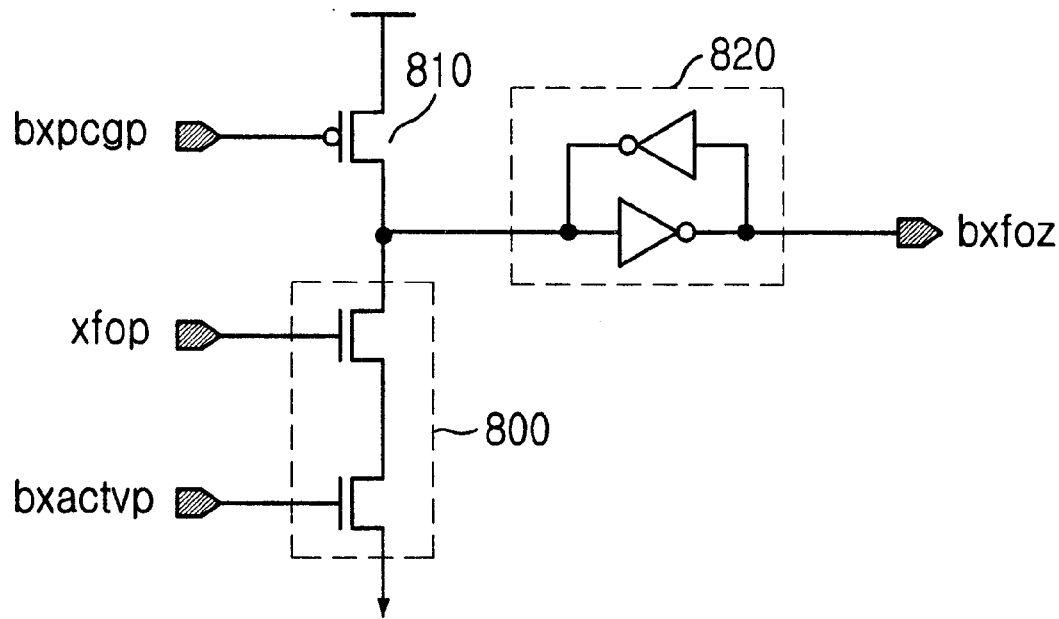
FIG. 8 is a circuit diagram of a bank row fuse decoder in accordance with the present invention.

FIG. 8 is a circuit diagram of a bank row fuse decoder. Referring to FIG. 8, the bank row fuse decoder includes two NMOS transistors 800, their gates respectively receiving a bank active pulse signal bxactvp activating the bank and the row fuse output signal xfop, and their source-drains serially coupled between a node b and a ground; a PMOS transistor 810 having a gate which receives a bank pre-charge pulse signal bxpcgp for pre-charging the bank when the bank is deactivated, and a source-drain formed between a power voltage and the node b; and a latch 820 for latching the bank row fuse output signal bxfoz in response to the node b.

In operation, when the bank active pulse signal bxactvp and the row fuse output signal xfop are activated to logic high, the bank pre-charge pulse signal bxpcgp pre-charging the node b to logic high discharges the node b to the ground so as to activate the bank row fuse output signal bxfoz to logic high.

Figure 9:
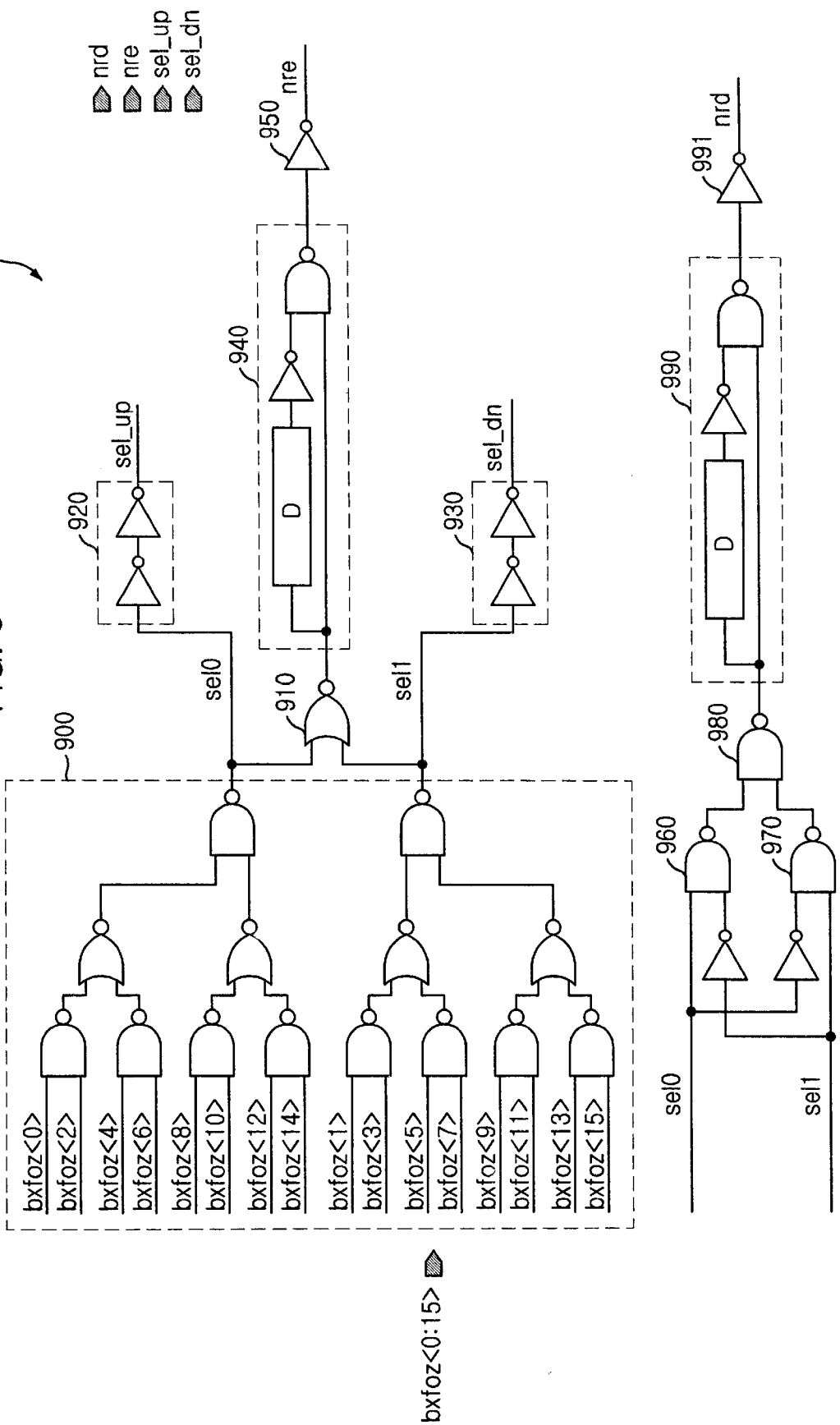
FIG. 9 is a circuit diagram of a repair controlling unit in accordance with the present invention.

FIG. 9 shows a circuit diagram of a repair controlling unit 610. Referring to FIG. 9, the repair controlling unit 610 includes a summing unit 900 for OR-operating the bank row fuse output signal bxfoz<0:15>, a NOR gate 910 for NOR-operating a first output signal sel0 and a second output signal sel1 of the summing unit 900, two serially coupled first inverters 920 for delaying the first output signal sel0 to output an upper selection signal sel_up, two serially coupled second inverters 930 for delaying the second output signal sel1 to output a lower selection signal sel_dn, a first pulse generating unit 940 coupled to the output of the NOR gate 910 for generating a pulse, a third inverter 950 for inverting the output of the first pulse generating unit 940 to output the normal enable signal nre, a first NAND gate 960 for receiving the first output signal sel0 and the inverted second output signal sel1 and for NAND-operating them, a second NAND gate 970 for receiving the inverted first output signal sel0 and the second output signal sel1 and for NAND-operating them, a third NAND gate 980 for NAND-operating the outputs of the first NAND gate 960 and the second NAND gate 970, a second pulse generating unit 990 coupled to the output of the third NAND gate 980 for generating a pulse, and a fourth inverter for inverting the output of the second pulse generating 990 to the normal row disable signal nrd.

In normal operation, when the bank row fuse output signal bxfoz<0:15> is logic high, the normal row enable signal nre is activated to logic high and the first output signal sel0 and the second output signal sel1 are deactivated to logic low so that the normal row disable signal nrd is made as logic low to execute the normal operation. For repair operation, when some of the bank row fuse output signal bxfoz<0:15> are logic low, the normal row enable signal nre is deactivated to logic low and the first output signal sel0 or the second output signal sel1 is activated to logic high so that the normal row disable signal nrd is made as logic high to execute the repair operation.

Figure 10:
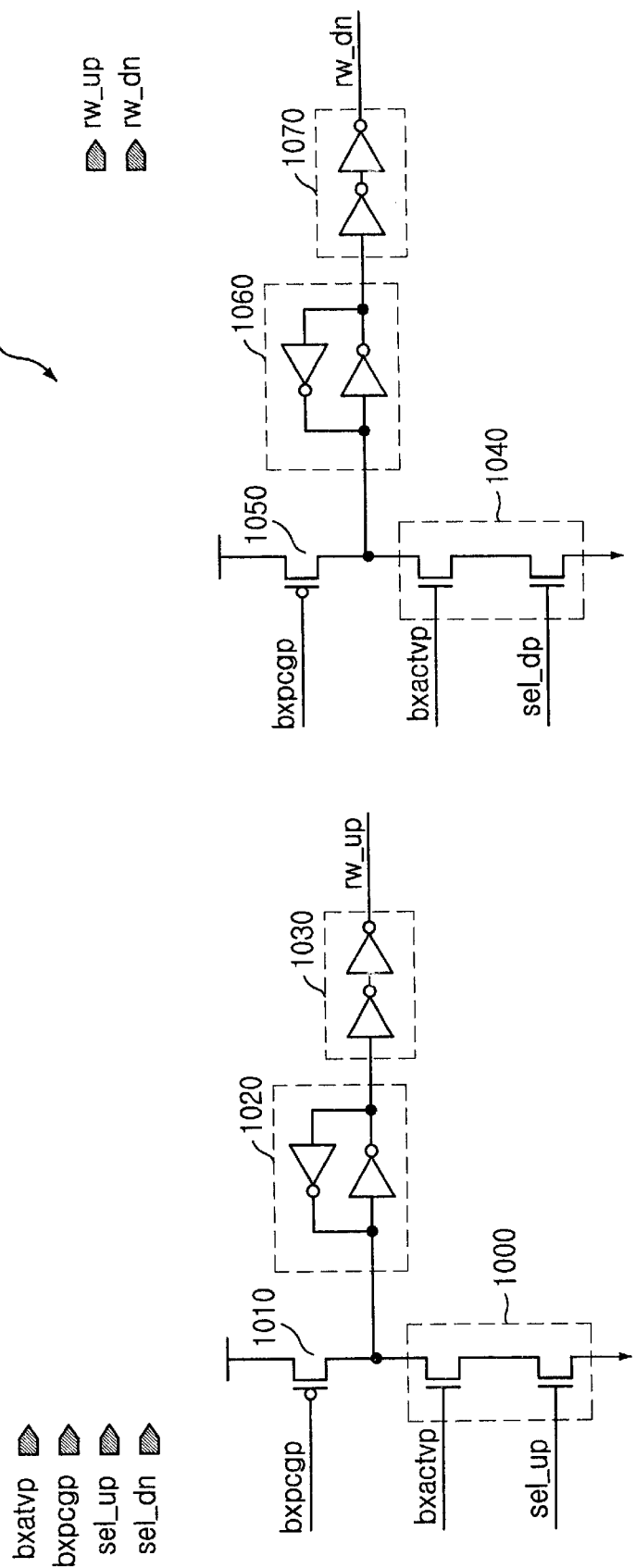
FIG. 10 illustrates a circuit diagram of a redundant word line selecting unit in accordance with the present invention.

FIG. 10 illustrates a circuit diagram of a redundant word line selecting unit 620. Referring to FIG. 10, the redundant word line selecting unit 620 includes two first NMOS transistors 1000 having gates for respectively receiving a bank active pulse signal bxactvp activating the bank and the upper selection signal sel_up, and source-drains serially coupled between a node c and the ground; a first PMOS transistor 1010 having a gate receiving the bank pre-charge pulse signal bxpcgp for pre-charging the bank when the bank is deactivated, and a source-drain formed between the power voltage and the node c; a first latch 1020 for latching the node c; two first inverters 1030 coupled to the output of the first latch to output an upper redundant word line signal rw_up; two second NMOS transistors 1040 having gates for respectively receiving the bank active pulse signal bxactvp activating the bank and the lower selection signal sel_dn, and source-drains serially coupled between a node d and the ground; a second PMOS transistor 1050 having a gate receiving the bank pre-charge pulse signal bxpcgp for pre-charging the bank when the bank is deactivated and a source-drain formed between the power voltage and the node d; a second latch 1060 for latching the node d; and two inverters 1070 coupled to the output of the second latch to output a lower redundant word line signal rw_dn.

The redundant word line selecting unit 620 receives the upper selection signal sel_up and the lower selection signal sel_dn and activates one of the upper redundant word line signal rw_up and the lower redundant word line signal rw_dn of the sub-block so as to select one of an upper word line and a lower word line of the sub-block.

Figure 11:
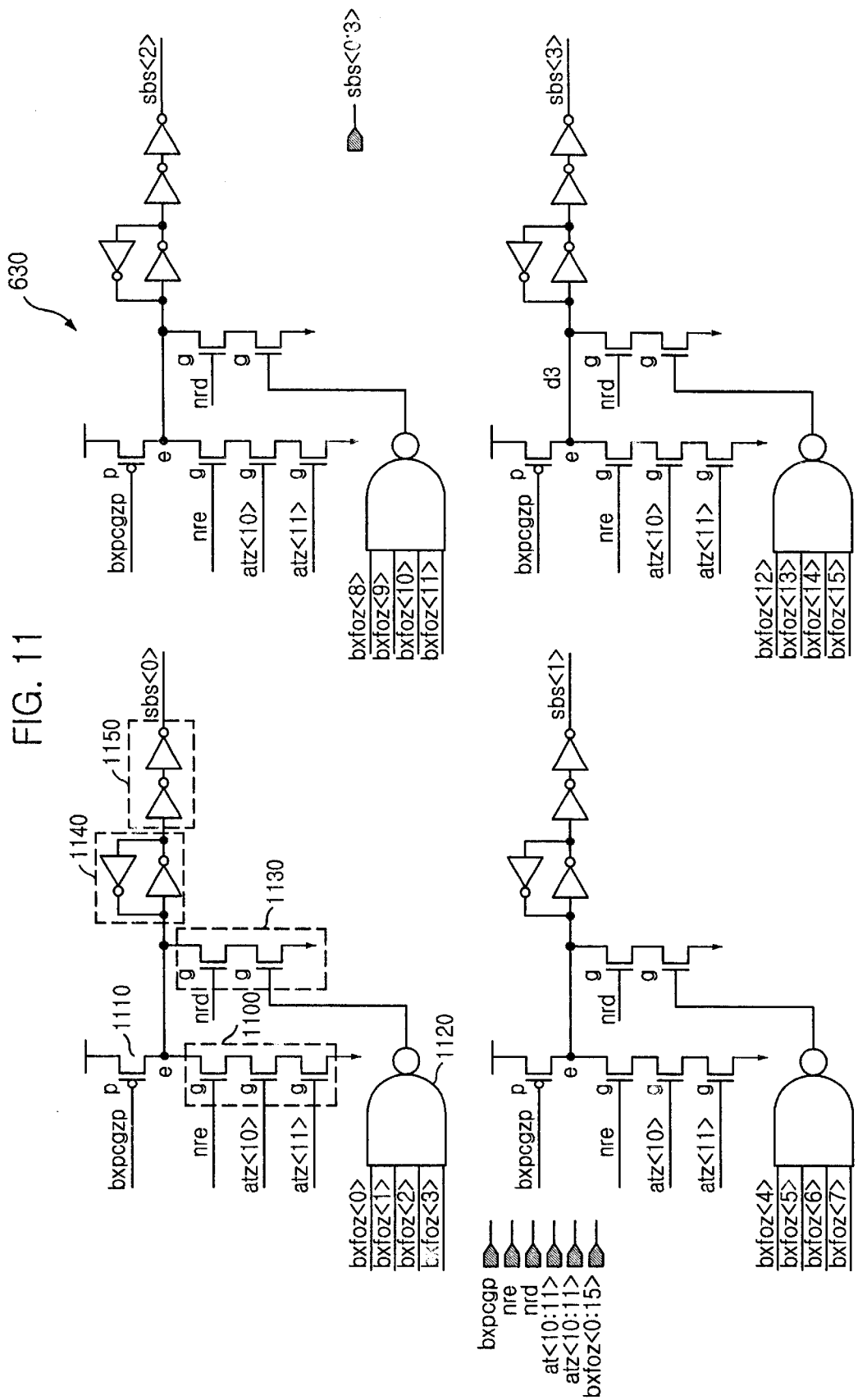
FIG. 11 is a circuit diagram of a sub-block selecting unit in accordance with the present invention.

FIG. 11 is a circuit diagram of a sub-block selecting unit 630. Referring to FIG. 11, the sub-block selecting unit 630 includes three NMOS transistors 1100 having gates for respectively receiving the normal row enable signal nre, a tenth row address atz<10> and an eleventh row address atz<11>, and serially coupled between a node e and the ground; a PMOS transistor 1110 having a gate receiving the bank pre-charge pulse signal bxpcgp, and a source-drain formed between the power voltage and the node e; a NAND gate 1120 for NAND-operating the bank row fuse output signal bxfoz<0:3>; two NMOS transistors 1130 having gates for respectively receiving the output of the NAND gate 1120 and the normal row disable signal nrd, and coupled serially between the node e and the ground; a latch 1140 for latching the node e; and two serially coupled inverters 1150 for delaying the output of the latch 1140 by a predetermined time delay to output a sub-block selection signal sbs<0>.

In addition, there are shown three other circuits identical to the circuit as described above and, during the normal operation, each sub-block selection signal sbs<0:3> is determined depending on the tenth and eleventh row addresses.

The bank row fuse output signal bxfoz<0:15> for 16 banks is divided by four and then applied to the input of the NAND gate 1120 and, for the repair operation, one of the four sub-block selection signals sbs<0:3> is selected. For the normal operation, the normal row enable signal nre is logic high and, for the repair operation, the normal row disable signal nrd is logic high.

As described above, by using a bank-flexible row redundancy scheme independently of banks in the present invention, any arbitrary fuse box can repair the failed cell so that the number of fuse boxes can be reduced and, therefore, layout size can be reduced and repair efficiency can be increased.

While the present invention has been shown and described with respect to the particular embodiments, it will be apparent to those skilled in the art that many changes and modifications may be made without departing from the spirit and scope of the invention as defined in the appended claims.

What is claimed is:

1. In a semiconductor memory device, a row redundancy circuit comprising:
   a fuse box receiving a row address and a bank address from an address buffer in which a fuse corresponding to an address of a word line to be repaired blows-out;
   a row fuse decoder for AND-operating two outputs of the fuse box; and
   a bank row address latching means coupled to an output of the row fuse decoder for determining a location of a redundant word line in a block to be repaired.

2. The row redundancy circuit as recited in claim 1, wherein the fuse boxe includes:
   an NMOS transistor having a gate for receiving a fuse pre-charge signal and a source-drain formed between a first node and a ground;
   a plurality of parallel-coupled NMOS transistors, each having a gate for receiving a corresponding one of 0-th to 13-th row addresses and a source-drain formed between a second node and a third node;
   a PMOS transistor having a gate for receiving the fuse pre-charge signal and a source-drain formed between a power voltage and the second node; and
   a latch for latching a signal applied to the second node to output a fuse output signal.

3. The row redundancy circuit as recited in claim 1, wherein the row fuse decoder includes:
   a NAND gate for receiving a fuse output signal from the fuse box; and
   an inverter for inverting an output of the NAND gate.

4. The row redundancy circuit as recited in claim 1, wherein the bank row address latching means includes:
   a bank row fuse decoder for receiving a bank row fuse output signal from the row fuse decoder for selecting a bank to be activated;
   repair controlling means for receiving a bank row fuse output signal from the bank row fuse decoder for selecting the location of the word line to be repaired;
   redundant word line selecting means for receiving an upper selection signal and a lower selection signal from the repair controlling means for selecting a redundant word line in a sub-block; and
   sub-block selecting means for receiving a normal row enable signal and a normal row disable signal from the repair controlling means for selecting one of four sub-blocks in a bank.

5. The row redundancy circuit as recited in claim 4, wherein the bank row fuse decoder includes:
   two NMOS transistors with respective gates for respectively receiving a bank active pulse signal activating the bank and the bank row fuse output signal, source-drains of said NMOS transistors being serially coupled between a node and a ground;
   a PMOS transistor having a gate for receiving a bank pre-charge pulse signal for pre-charging the bank when the bank is deactivated and a source-drain formed between a power voltage and the node; and
   a latch for latching the bank row fuse output signal in response to the node.

6. The row redundancy circuit as recited in claim 4, wherein the repair controlling means includes:
- summing means for OR-operating the bank row fuse output signal;
- a NOR gate for NOR-operating a first output signal and a second output signal of the summing means;
- two serially-coupled first inverters for delaying the first output signal to output an upper selection signal;
- two serially-coupled second inverters for delaying the second output signal to output a lower selection signal;
- a first pulse generating means coupled to an output of the NOR gate for generating a pulse;
- a third inverter for inverting an output of the first pulse generating means to output the normal row enable signal;
- a first NAND gate for receiving and NAND-operating the first output signal and an inverted second output signal;
- a second NAND gate for receiving and NAND-operating an inverted first output signal and the second output signal;
- a third NAND gate for NAND-operating outputs of first NAND gate and the second NAND gate;
- a second pulse generating means coupled to an output of the third NAND gate for generating a pulse; and
- a fourth inverter for inverting an output of the second pulse generating means to the normal row disable signal.

7. The row redundancy circuit as recited in claim 4, wherein the redundant word line selecting means includes:
- two first NMOS transistors having respective gates for respectively receiving a bank active pulse signal activating the bank and the upper selection signal, and having source-drains serially coupled between a second node and a ground;
- a first PMOS transistor having a gate for receiving a bank pre-charge pulse signal for pre-charging the bank when the bank is deactivated and a source-drain coupled between a power voltage and the second node;
- a first latch for latching the second node;
- two first inverters coupled to an output of the first latch to output an upper redundant word line signal;
- two second NMOS transistors having respective gates for respectively receiving the bank active pulse signal activating the bank and the lower selection signal, and having source-drains serially coupled between a third node and the ground;
- a second PMOS transistor having a gate for receiving the bank pre-charge pulse signal for pre-charging the bank when the bank is deactivated and a source-drain coupled between the power voltage and the third node;
- a second latch for latching the third node; and
- two inverters coupled to an output of the second latch to output a lower redundant word line signal.

8. The row redundancy circuit as recited in claim 4, wherein the sub-block selecting means includes:
- three NMOS transistors having respective gates for respectively receiving the normal row enable signal, tenth row address and eleventh row address, and serially coupled between a second node and a ground;
- a PMOS transistor having a gate for receiving a bank pre-charge pulse signal and a source-drain formed between a power voltage and the second node;
- a NAND gate for NAND-operating the bank row fuse output signal;
- two NMOS transistors having respective gates for respectively receiving an output of the NAND gate and the normal row disable signal, and coupled serially between the second node and the ground;
- a latch for latching the second node; and
- two serially coupled inverters for delaying an output of the latch by a predetermined time delay to output a sub-block selection signal.

\* \* \* \* \*